(12) United States Patent
Akram et al.

(10) Patent No.: US 6,255,833 B1
(45) Date of Patent: Jul. 3, 2001

(54) METHOD FOR TESTING SEMICONDUCTOR DICE AND CHIP SCALE PACKAGES

(75) Inventors: Salman Akram; Alan G. Wood; David R. Hembree, all of Boise; Warren M. Farnworth, Nampa, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/098,594

(22) Filed: Jun. 17, 1998

Related U.S. Application Data

(62) Division of application No. 08/674,473, filed on Mar. 4, 1997, now Pat. No. 5,929,647.

(51) Int. Cl.⁷ ................................................. G01R 31/02
(52) U.S. Cl. ........................................... 324/755; 324/765
(58) Field of Search .................................... 324/755, 754, 324/537, 538, 757, 758, 765, 767; 439/66, 68, 71

(56) References Cited

U.S. PATENT DOCUMENTS

| | | | |
|---|---|---|---|
| 4,169,642 | 10/1979 | Mouissie | 339/17 F |
| 4,783,719 | 11/1988 | Jamison et al. | 361/398 |
| 4,891,687 | 1/1990 | Mallik et al. | 357/70 |
| 4,899,107 | 2/1990 | Corbett et al. | 324/158 F |
| 4,899,921 | 2/1990 | Bendat et al. | 228/105 |
| 4,969,828 | 11/1990 | Bright et al. | 439/68 |
| 5,006,792 | 4/1991 | Malhi et al. | 324/158 F |
| 5,012,323 | 4/1991 | Farnworth | 357/75 |
| 5,073,117 | 12/1991 | Malhi et al. | 439/71 |
| 5,088,190 | 2/1992 | Malhi et al. | 29/843 |
| 5,107,328 | 4/1992 | Kinsman | 357/74 |
| 5,140,404 | 8/1992 | Fogal et al. | 357/70 |
| 5,155,067 | 10/1992 | Wood et al. | 437/209 |
| 5,180,974 | 1/1993 | Mitchell et al. | 324/158 F |
| 5,214,845 | 6/1993 | King et al. | 29/841 |
| 5,272,590 | 12/1993 | Hernandez | 361/306.2 |
| 5,283,717 | 2/1994 | Hundt | 361/813 |
| 5,302,891 | 4/1994 | Wood et al. | 324/158 F |
| 5,326,428 | 7/1994 | Farnworth et al. | 156/654 |
| 5,399,903 | 3/1995 | Rostoker et al. | 257/666 |
| 5,408,190 | 4/1995 | Wood et al. | 324/765 |
| 5,419,807 | 5/1995 | Akram et al. | 156/647.1 |
| 5,422,435 | 6/1995 | Takiar et al. | 174/52.4 |
| 5,424,652 | 6/1995 | Hembree et al. | 324/765 |
| 5,440,240 | 8/1995 | Wood et al. | 324/765 |
| 5,451,165 | 9/1995 | Cearley-Cabbiness et al. | 439/71 |
| 5,468,992 | 11/1995 | Kanekawa et al. | 257/676 |

(List continued on next page.)

OTHER PUBLICATIONS

"Chip Scale Review", Technical Brochure, May 1997.

*Primary Examiner*—Ernest Karlsen
(74) *Attorney, Agent, or Firm*—Stephen A. Gratton

(57) ABSTRACT

A method and carrier for testing semiconductor dice such as bare dice or chip scale packages are provided. The carrier includes a base for retaining a single die, an interconnect for establishing temporary electrical communication with the die, and a force applying mechanism for biasing the die and interconnect together. In an illustrative embodiment the base includes conductors arranged in a universal pattern adapted to electrically connect to different sized interconnects. Interconnects are thus interchangeable on a base for testing different types of dice using the same base. The conductors on the base can be formed on a planar active surface of the base or on a stepped active surface having different sized cavities for mounting different sized interconnects.

In an alternate embodiment the carrier includes an interposer. In a first interposer embodiment, the interposer connects directly to external test circuitry and can be changed to accommodate different sized interconnects. In a second interposer embodiment, the interposer connects to conductors on the base and adapts the base for use with different sized interconnects.

4 Claims, 5 Drawing Sheets

U.S. PATENT DOCUMENTS

| | | |
|---|---|---|
| 5,468,999 | 11/1995 | Lin et al. .............................. 257/784 |
| 5,483,741 | 1/1996 | Akram et al. ......................... 29/846 |
| 5,495,179 | 2/1996 | Wood et al. .......................... 324/755 |
| 5,497,031 | 3/1996 | Kozono ................................. 257/700 |
| 5,498,900 | 3/1996 | Dunaway et al. .................... 257/659 |
| 5,519,332 | 5/1996 | Wood et al. .......................... 324/755 |
| 5,541,525 | 7/1996 | Wood et al. .......................... 324/755 |
| 5,578,934 | 11/1996 | Wood et al. .......................... 324/758 |
| 5,634,267 | 6/1997 | Farnworth et al. .................... 29/840 |
| 5,678,301 | 10/1997 | Gochnour et al. . |
| 5,686,317 | 11/1997 | Akram et al. ............................ 437/8 |
| 5,691,649 | 11/1997 | Farnworth et al. . |
| 5,739,050 | 4/1998 | Farnworth ............................... 438/15 |
| 5,742,169 | 4/1998 | Akram et al. ......................... 324/755 |
| 5,783,461 | 7/1998 | Hembree . |
| 5,789,271 | 8/1998 | Akram . |
| 5,796,264 | 8/1998 | Farnworth et al. . |
| 5,815,000 | 9/1998 | Farnworth et al. . |
| 5,825,195 | 10/1998 | Hembree et al. . |
| 5,834,945 | 11/1998 | Akram et al. . |
| 5,844,418 | 12/1998 | Wood et al. . |
| 5,878,485 | 2/1999 | Wood et al. . |
| 5,896,036 | 4/1999 | Wood et al. . |
| 5,929,647 | 7/1999 | Akram et al. . |
| 5,949,242 | 9/1999 | Wood et al. . |
| 5,982,185 | 11/1999 | Farnworth . |
| 6,060,893 | 5/2000 | Farnworth et al. . |
| 6,068,669 | 5/2000 | Farnworth et al. . |

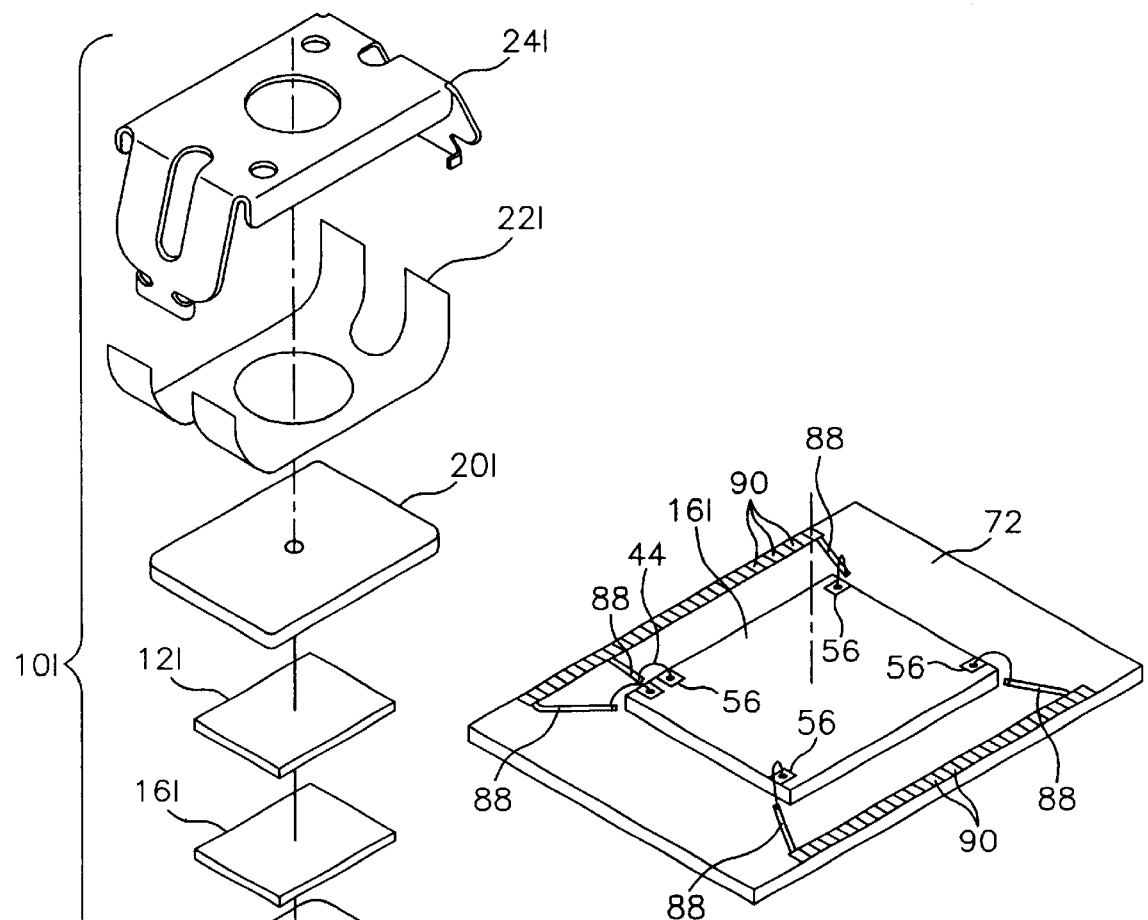
FIGURE 12
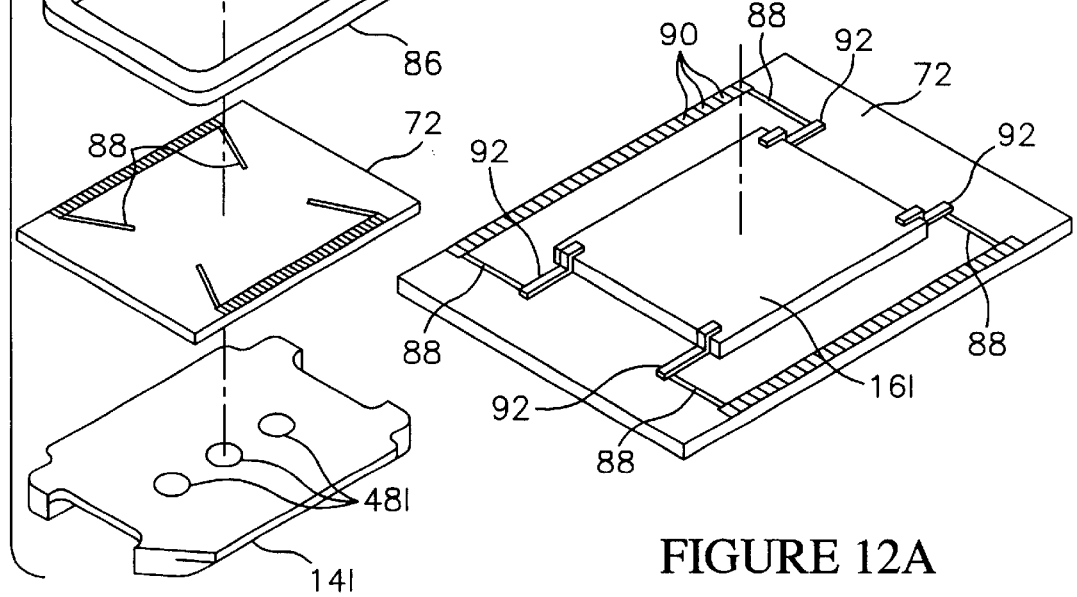
FIGURE 12A
FIGURE 11

METHOD FOR TESTING SEMICONDUCTOR DICE AND CHIP SCALE PACKAGES

CROSS REFERENCE TO RELATED APPLICATIONS

This application is a division of application Ser. No. 08/674,473 filed Mar. 4, 1997, now U.S. Pat. No. 5,929,647.

FIELD OF THE INVENTION

This invention relates generally to semiconductor manufacture and more particularly to an improved method and apparatus for testing semiconductor dice including bare dice or dice encapsulated in chip scale packages.

BACKGROUND OF THE INVENTION

Recently, semiconductor dice have been supplied by manufacturers in an unpackaged or bare configuration. A known good die (KGD) is an unpackaged die that has been tested to a quality and reliability level equal to the packaged product. To certify a die as a known good die the unpackaged die must be burn-in tested. This has led to the development of test carriers that hold a single unpackaged die for burn-in and other tests. Each test carrier houses a die for testing and also provides the electrical interconnection between the die and external test circuitry. Exemplary test carriers are disclosed in U.S. Pat. Nos. 5,302,891; 5,408,190; 5,495,179 and 5,519,332 to Wood et al.

This type of test carrier includes external leads adapted to electrically connect to test circuitry via a burn-in board or other electrical receptacle. In addition, an interconnect component of the test carrier provides a temporary electrical connection between the bond pads on the die and external leads on the carrier. In the assembled carrier, a force distribution mechanism biases the device under test (DUT) against the interconnect.

One design consideration for this type of carrier is the electrical path between the carrier and the interconnect. Typically the carrier includes conductors in electrical communication with the external leads for the carrier. These conductors can be formed by plating, printing or depositing a highly conductive metal on a surface of the carrier. The interconnect also includes conductors in electrical communication with contact members that contact the bond pads on the die.

The electrical path between the conductors on the carrier and the conductors on the interconnect can be a wire bond or a mechanical electrical connection such as clips. It is desirable to minimize the length of this electrical path in order reduce parasitic induction and cross coupling of the test signals applied to the die. In addition, it is desirable that this electrical path be low resistance and reliable even with long term handling of the carrier in a production environment. For example, with an electrical path formed by wire bonds, the placement and integrity of the bond sites during their formation and continued usage can be a factor in the electrical performance of the carrier.

Another design consideration for this type of carrier is its suitability for use with different types of semiconductor dice and with the different types of interconnects needed to electrically connect to the dice. In general, semiconductor dice are fabricated in a variety of sizes and bond pad configurations. For example, conventional bare dice can have bond pads formed along their longitudinal edges (edge connect) or along their ends (end connect). On the other hand, a lead on chip (LOC) die can have bond pads formed along the center line of the die face. It would be desirable to have a carrier with a universal design able to accommodate the different types of semiconductor dice and the different types of interconnects required for electrical connection to the dice.

Furthermore, since the interconnects for a carrier are relatively expensive to manufacture, it would be desirable for the carrier to function with an interconnect that is as small as possible. Specifically, a peripheral outline of the interconnect should be just large enough to test a particular die configuration. This would help to keep the cost of the interconnects as low as possible, especially for silicon interconnects. However, as the size of the interconnects decreases the electrical connection with the interconnect becomes more difficult. Accordingly the carrier should also be constructed to make a reliable electrical connection with the interconnect regardless of size.

Other design considerations for a carrier include electrical performance over a wide temperature range, thermal management, power and signal distribution, the cost and reusability of the carrier, and the ability to remove and replace the interconnect. In addition, a carrier should be suitable for use with automated equipment and assembly procedures utilized in high volume semiconductor manufacture.

SUMMARY OF THE INVENTION

In accordance with the present invention, an improved method and apparatus for testing semiconductor dice are provided. The apparatus is in the form of a carrier comprising a base, an interconnect and a force applying mechanism. The base is adapted to retain a die and the interconnect and includes external leads connectable to external test circuitry associated with a burn-in board or other test apparatus.

The interconnect mounts to the base and includes contact members adapted to contact the die bond pads to establish temporary electrical communication with the die. The interconnect also includes conductive traces in electrical communication with the contact members. An electrical path is formed between the conductive traces on the interconnect and corresponding conductors on the base by wire bonding, tab bonding or slide clips. The force applying mechanism attaches to the base and is adapted to apply a biasing force to bias the die and interconnect together.

In a first embodiment of the carrier, the base includes a planar active surface for mounting the interconnect. The planar active surface includes a pattern of conductors. The interconnect mounts directly on top of the conductors with an insulating layer, such as a polymeric adhesive, placed therebetween. The conductors are formed in a universal pattern configured to accommodate different sizes of interconnects with a minimum length electrical path. For example, wire bonds can be formed between the conductors on the base and corresponding conductive traces on the interconnect. The universal pattern of conductors permits different sized interconnects to be easily interchangeable, and a reliable electrical connection to be made between the interconnect and base with reduced parasitic inductance.

In a second embodiment of the carrier, the base is formed with a stepped active surface rather than a planar active surface. The stepped active surface includes different support surfaces adapted to support interconnects having different sizes. Once again the conductors are formed over the stepped support surfaces in a universal pattern that permits wire bonds, or other electrical paths, to be formed between the base and interconnects with a minimum path length.

In a third embodiment of the carrier, an interposer is mounted to the base to provide a mounting surface for the interconnect and an electrical path to the interconnect. The interposer is an element that adapts the carrier for use with different types of interconnects for testing different types of semiconductor dice. In a first interposer embodiment, the interposer includes a pattern of conductors configured for connection to external test circuitry. The conductors in the interposer can be wire bonded, tab bonded or otherwise connected to conductors on the interconnect. In a second interposer embodiment, the interposer is an element that adapts a standard carrier for use with different interconnects suited for testing different types of semiconductor dice. In this embodiment the electrical path from external test circuitry is through the base and through the interposer to the interconnect.

BRIEF DESCRIPTION OF THE DRAWINGS

FIG. 11 is an exploded perspective view of an alternate embodiment carrier having an interposer for mounting the interconnect;

FIG. 12 is an enlarged perspective view of the interposer shown in FIG. 11 with a conductive path formed between the interposer and interconnect by wire bonding;

FIG. 12A is an enlarged perspective view of the interposer shown in FIG. 11 with a conductive path formed between the interposer and interconnect using TAB tape;

DETAILED DESCRIPTION OF THE PREFERRED EMBODIMENT

Figure 1:
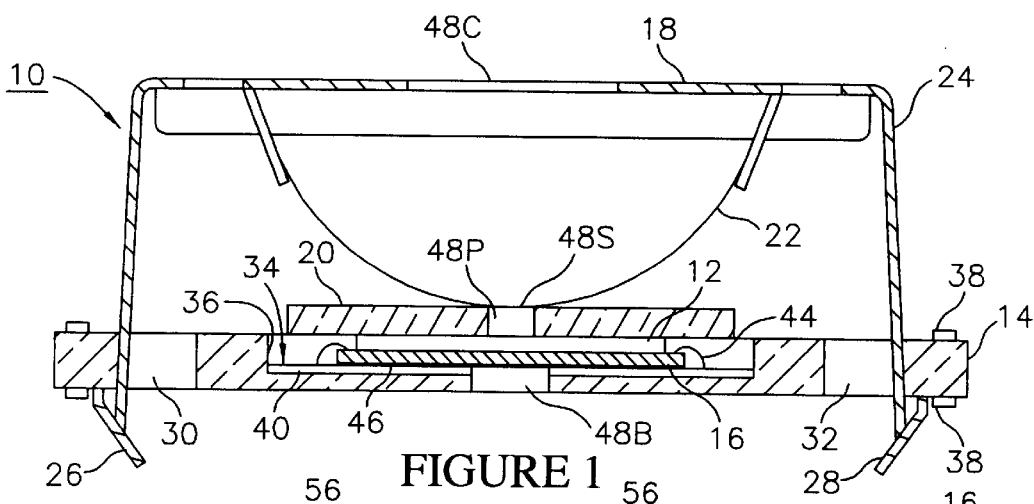
FIG. 1 is a cross sectional view of a carrier constructed in accordance with the invention.

Referring to FIG. 1, a carrier 10 constructed in accordance with the invention is shown. The carrier 10 is adapted to establish temporary electrical communication with a semiconductor die 12 for testing or other purposes. In the illustrative embodiment the die 12 is a bare or unpackaged semiconductor die. A bare die does not include a conventional plastic or ceramic package. However, it is to be understood that the carrier 10 is also suitable for testing a chip scale semiconductor package. Chip scale semiconductor packages can include thin protective covers formed of glass or other materials bonded to the face and backside of a bare die.

The carrier 10 includes a carrier base 14, an interconnect 16 and a force applying mechanism 18. The interconnect 16 is adapted to establish temporary electrical communication with the die 12. The assembled carrier 10 is designed to be placed in a burn-in oven (not shown) or other test fixture for testing the die 12. The burn-in oven typically includes a socket or printed circuit board (PCB) in electrical communication with external test circuitry.

The force applying mechanism 18 secures the die 12 to the base 14 and presses the die 12 against the interconnect 16. The force applying mechanism 18 includes a pressure plate 20, a spring 22 and a bridge clamp 24. The force applying mechanism 18 also includes a latching mechanism in the form of clips 26, 28 on the bridge clamps 24 which secure the force applying mechanism 18 to the base 14. The clips 26, 28 attach to corresponding openings 30, 32 formed in the base 14.

Still referring to FIG. 1, the carrier base 14 also includes an active surface 34 and a recess 36 wherein the interconnect 16 is mounted. In addition, the bridge clamp 24, the spring 22, and the pressure plate 20 all include a central opening which are designated 48C, 48S and 48P respectively. The openings 48C, 48S and 48P are used during assembly of the carrier 10 to permit the die 12 to be held by a vacuum tool (not shown) during optical alignment of the die 12 and interconnect 16. In a similar manner, a vacuum tool (not shown) can be used to disassemble the package 10. The base 14 can also include an opening 48B to permit access to the interconnect 16 for assembly and disassembly.

The interconnect 16 can be wire bonded to the base 14 with bond wires 44. The bond wires 44 attach to conductors 40 formed on the active surface 34 of the base 14 and to corresponding bonding pads 56 (FIG. 2) for conductive traces 58 (FIG. 2) formed on the interconnect 16. The conductors 40 on the base 14 are in electrical communication with external leads 38 formed on the base 14. This electrical communication can be established by internal or external traces (not shown) formed on the base 14 as required.

The carrier 10 can be assembled using optical alignment techniques and aligner bonder tools used for flip chip bonding semiconductor dice. Flip chip bonding refers to a process wherein a semiconductor die is placed face down on a substrate, such as a printed circuit board, and the bond pads on the die are bonded to connection points on the substrate. Tools for flip chip bonding are sometimes referred to as aligner bonders. An aligner bonder and method of optical alignment for flip chip bonding are described in U.S. Pat. No. 4,899,921 to Bendat et al, entitled "Aligner Bonder". Such an aligner bonder is available from Research Devices of Piscataway, N.J.

U.S. Pat. No. 5,634,267 incorporated herein by reference, describes an automated apparatus suitable for optically aligning the die 12 and interconnect 16 and securing the force applying mechanism 18 to the package base 14.

Following the assembly procedure the carrier 10 can be used to test the die 16. Testing can include full functionality as well as burn-in testing. Following the test procedure, the carrier 10 can be disassembled using an assembly tool (not shown) to remove the clips 26, 28 and force applying mechanism 18 substantially as previously described for the assembly procedure.

Figure 2:
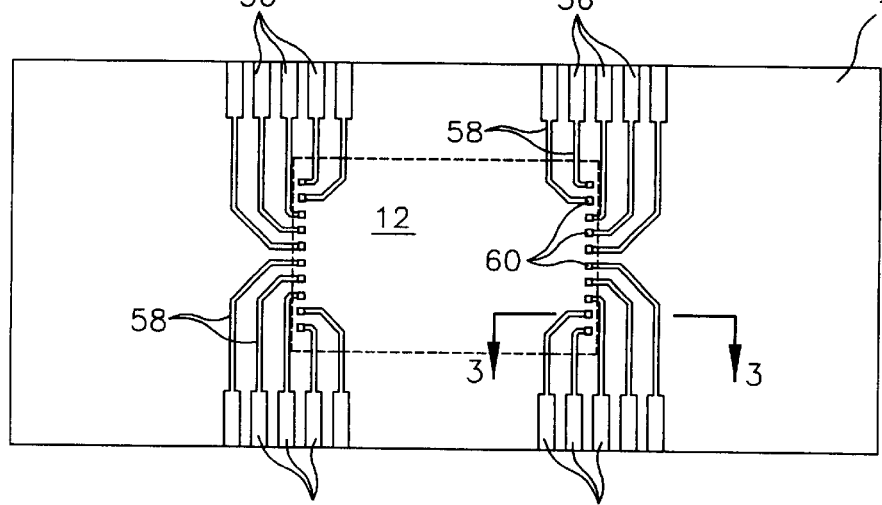
FIG. 2 is a plan view of an interconnect for the carrier shown in FIG. 1.
Figure 3:
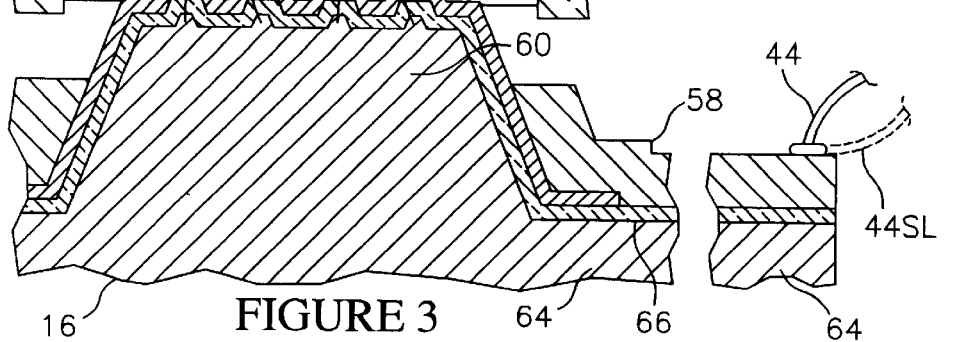
FIG. 3 is a cross sectional view taken along section line 3—3 of FIG. 2.

Referring to FIG. 2, the interconnect 16 includes a pattern of conductive traces 58 and raised contact members 60. The raised contact members 60 are formed in a pattern that corresponds to test pads 62 (FIG. 3) on the die 12. The test pads 62 will typically be the die bond pads. As shown in FIG. 3, the raised contact members 60 are adapted to contact and establish temporary electrical communication with the test pads 62 on the die 12. In addition, the raised contact members 60 can include penetrating projections 70 formed as elongated blades adapted to penetrate the test pads 62 on the die 12 to a self limiting penetration depth.

The interconnect 16 and raised contact members 60 can be formed by etching a silicon substrate 64. An insulating layer 66 and a conductive layer 68 are formed on the substrate 64 atop the raised contact members 60. The conductive layer 68 is in electrical communication with the conductive traces 58. Each conductive trace 58 includes a bonding pad 56 formed at a terminal end. As will be further explained, the bonding pads 56 provide bonding sites for wire bonding the interconnect 16 to the base 14. Alternately, in place of wire bonding in the assembled carrier 10, an electrical path can be formed between the interconnect 16 and base 14 with slide contacts 44SL or TAB tape (not shown) in contact with the bonding pads 56.

A suitable process for forming the interconnect 16, substantially as shown in FIGS. 2 and 3, is disclosed in U.S. Pat. Nos. 5,326,428; 5,419,807 and 5,483,741 which are incorporated herein by reference.

Figure 4:
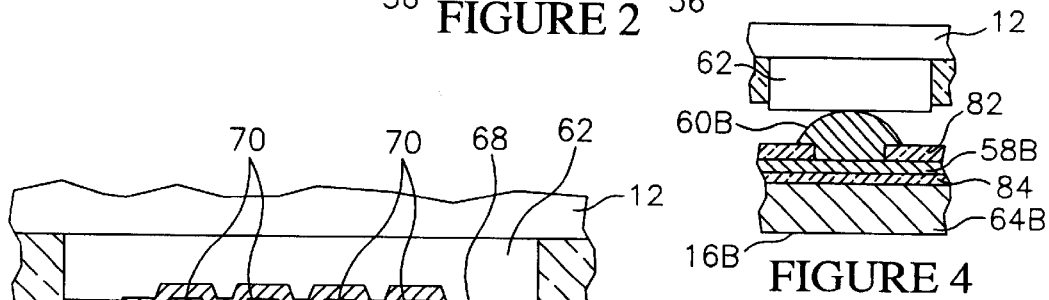
FIG. 4 is a cross sectional view equivalent to FIG. 3 of an alternate embodiment interconnect having microbump contact members.

With reference FIG. 4, an alternate embodiment interconnect 16B includes microbump contact members 60B and corresponding conductive traces 58B formed on a plastic film 82. The microbump contact members 60B and plastic film 82 can be similar to two layer TAB tape such as ASMAT manufactured by Nitto Denko. The plastic film 82 can be mounted to a substrate 64B, such as silicon, using a compliant adhesive layer 84. The compliant adhesive layer 84 can be formed of a silicone elastomer, an epoxy or a polyimide material. Methods for forming an interconnect with microbump contact members are described in U.S. Pat. No. 5,487,999 and U.S. Pat. No. 5,789,271 incorporated herein by reference.

Figure 5:
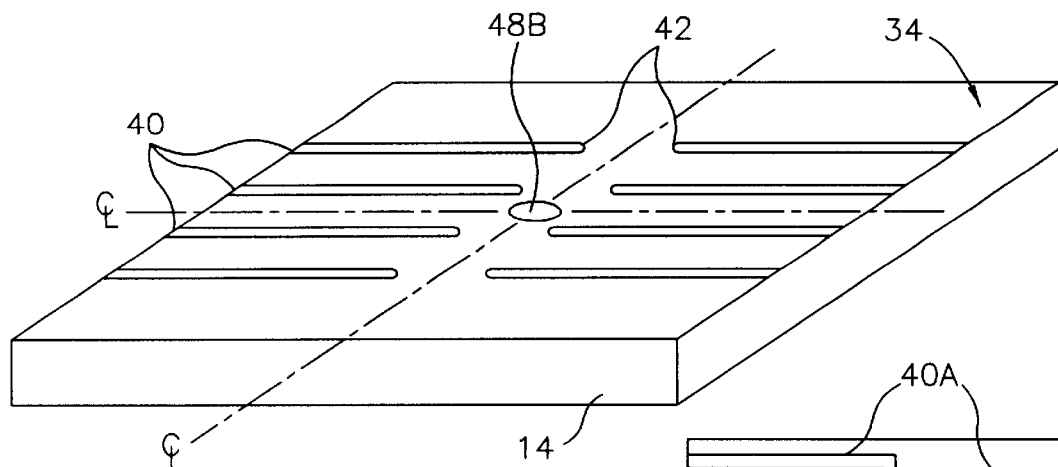
FIG. 5 is a perspective view of a base for the carrier of FIG. 1 having a planar active surface and pattern of conductors formed thereon.
Figure 6:
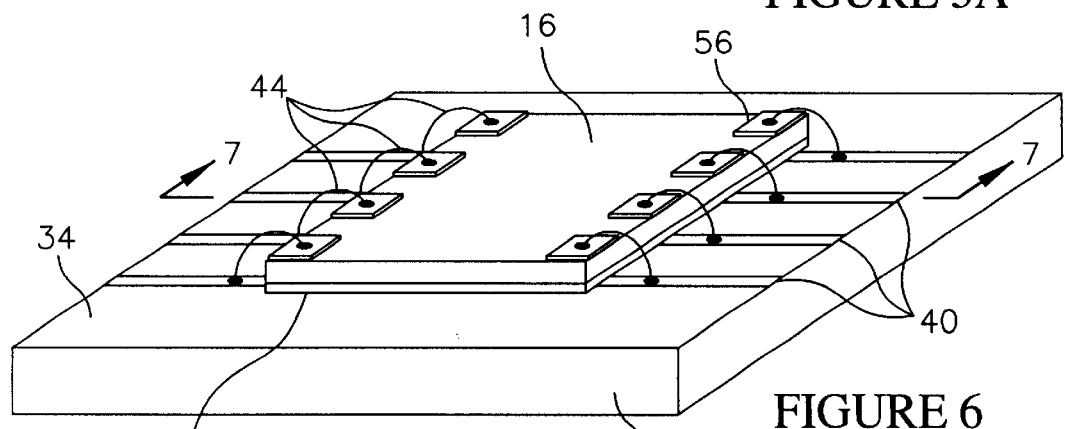
FIG. 6 is a perspective view of the planar active surface shown in FIG. 5 and the interconnect attached to the active surface.
Figure 7:
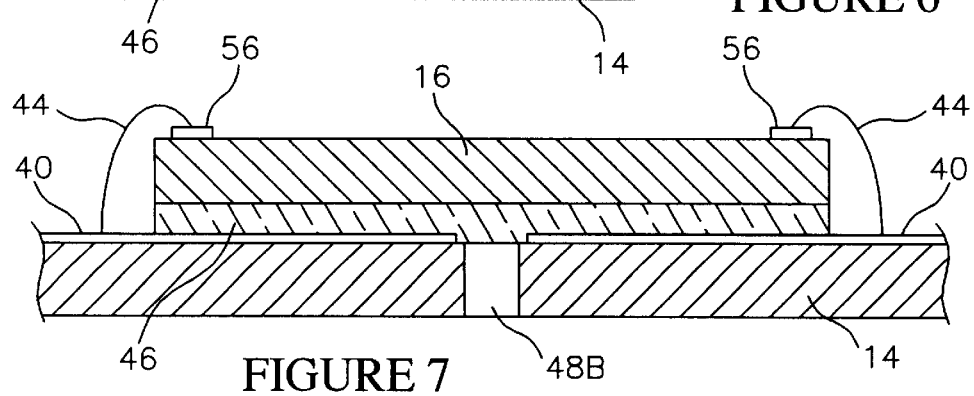
FIG. 7 is a cross sectional view taken along section line 7—7 of FIG. 6.

Referring to FIGS. 5–7, further details of the base 14 and the mounting of the interconnect 16 to the base 14 are shown. In FIG. 5, the active surface 34 of the base 14 is shown without the interconnect 16. The active surface 34 is generally planar and includes the pattern of conductors 40 formed thereon. The base 14 can be formed of an insulating material such as ceramic, plastic or a polymer resin using a suitable fabrication process. For example, a ceramic base 14 can be formed using a lamination process as disclosed in previously cited U.S. Pat. No. 5,519,332. A plastic base 14 can be formed using an injection molding process as also disclosed in U.S. Pat. No. 5,519,332.

The conductors 40 can be formed on the active surface 34 of the base using a suitable process such as plating, thin film deposition or screen printing. For example, the above cited U.S. Pat. No. 5,519,332 describes a thin film metallization process and a 3-D plating process for forming conductors. The conductors 40 can be formed of a highly conductive material that is also suitable for wire bonding. Preferred materials include gold, aluminum, copper and tungsten. The conductors 40 can also be formed of alloys of these metals or as stacks of these and other metals.

As shown in FIG. 5, each of the conductors 40 include a terminal portion 42 formed at a terminating end. The terminal portions 42 extend almost to a center line of the base 14 and are spaced apart by a distance that is less than the width of the interconnect 16. In addition, the area of the active surface 34, wherein the conductors 40 are formed, is larger than the peripheral outline of the interconnect 16. The pattern of conductors 40 are designed such that different sized interconnects 16 can be mounted directly on top of the conductors 40 and electrically attached to the conductors 40 with a minimally sized path length. Different interconnects 16, for testing different sized dice 12, can thus be easily mountable and interchangeable on base 14.

As shown in FIGS. 6 and 7, the interconnect 16 is mounted directly over the conductors 40. An insulating adhesive 46 can be used to secure the interconnect 16 to the active surface 34 of the base 14. One suitable adhesive is Zymet™ silicone elastomer manufactured by Zymet, Inc., East Hanover, N.J. Alternately, other suitable adhesives, such as two part non-conductive epoxies or Kapton tapes, can be employed in place of silicone elastomers.

As also shown in FIGS. 6 and 7, the bond wires 44 attach to the bonding pads 56 on the interconnect 16 and to bonding sites along the length of the conductors 40. Using this arrangement, the length of the bond wires 44 can be kept as small as possible even with different sized interconnects 16. This helps to provide a high reliability electrical connection with a relatively low resistance between the interconnect 16 and the conductors 40. In addition, parasitic inductance is reduced because the length of the bond wires 44 is as small as possible.

In the illustrative embodiment, the insulating adhesive 46 insulates the conductors 40 from the interconnect 16. Additionally, a backside of the interconnect 16 can be formed with the insulating layer 66 (FIG. 3) previously described to insulate the interconnect substrate 64 (FIG. 3) from the conductors 40. For example, with the interconnect 16 formed of silicon, the interconnect 16 can include a backside insulating layer (not shown) similar to insulating layer 66 (FIG. 3). Suitable materials for the backside insulating layer and insulating layer 66 include $SiO_2$ and $Si_3N_4$. As yet another alternative, the conductors 40 can be insulated from the interconnect 16 using an insulating layer (not shown) formed over the active area 34 of the base 14 and over the conductors 40. One suitable material for such an insulating layer would be a formed layer of polyimide.

Figure 5A:
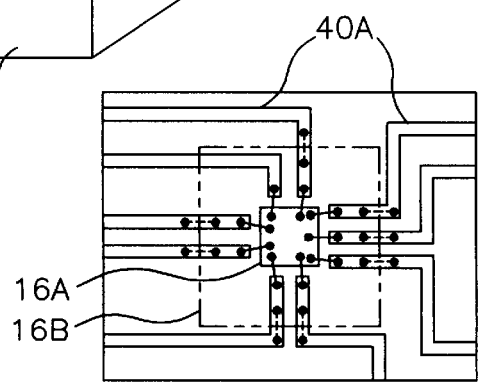
FIG. 5A is a plan view of an alternate embodiment conductor pattern for the base shown in FIG. 5.

As is apparent, the pattern of conductors 40 shown in FIGS. 5 and 6 is merely exemplary. The number and spacing of the conductors 40 is dependent on the number and spacing of the bonding pads 56 (FIG. 2) and contact members 60 (FIG. 2) on the interconnect 16. The number and spacing of the contact members 60 (FIG. 2) on the interconnect 16 are dependent on the number and spacing of the test pads 62 (FIG. 3) on the die 12. Since the test pads 62 (FIG. 3) will typically be the die bond pads, the size and spacing of the die bond pads will typically be the determining factor in forming the pattern of conductors 40. FIG. 5A illustrates another exemplary pattern of conductors 40A which can be used to electrically connect to an interconnect 16A or to an interconnect 16B shown in dotted lines.

Figure 8:
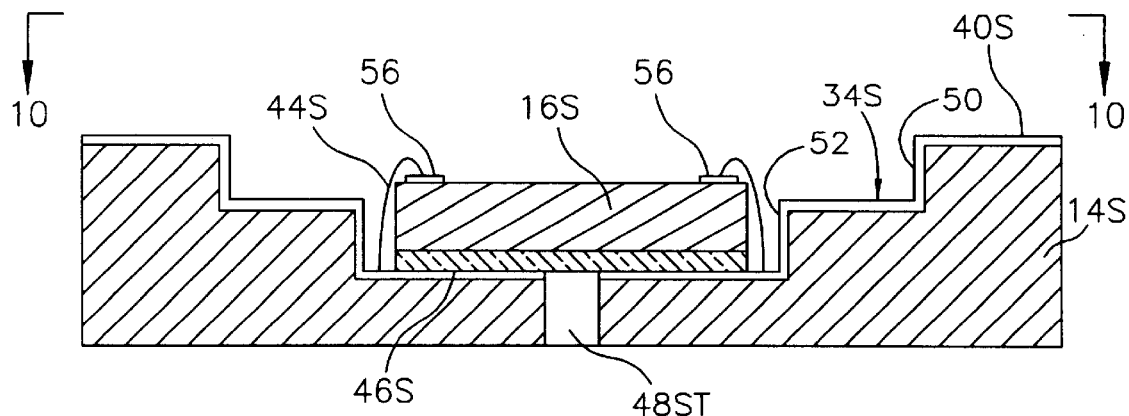
FIG. 8 is a cross sectional view of an alternate embodiment stepped carrier base constructed in accordance with the invention and showing the interconnect mounted therein.
Figure 9:
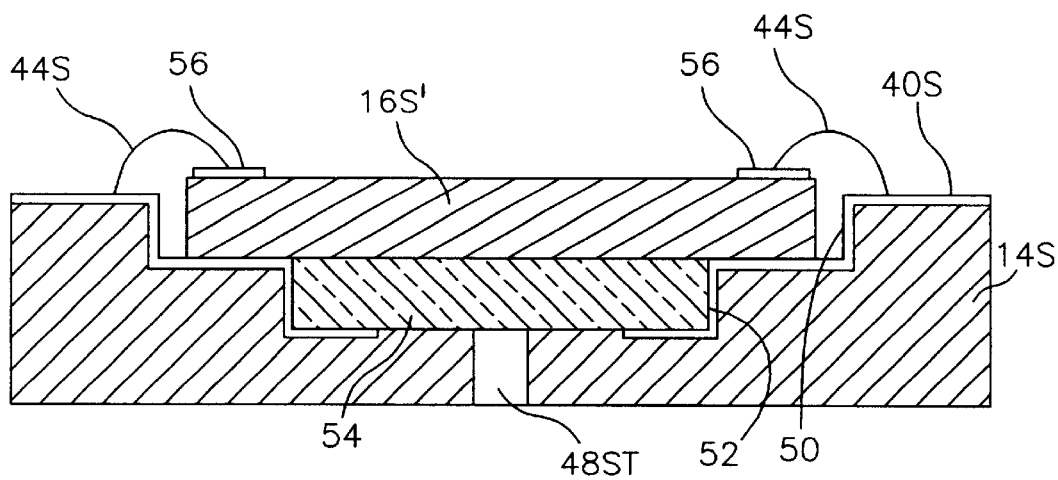
FIG. 9 is a cross sectional view of the alternate embodiment stepped base carrier shown in FIG. 8 but with another interconnect mounted therein.
Figure 10:
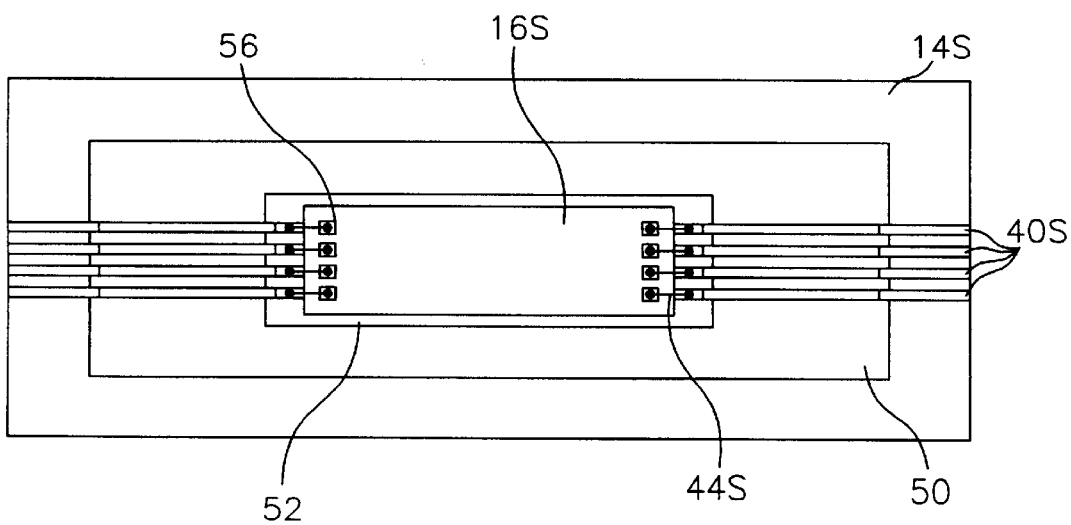
FIG. 10 is a plan view taken along section line 10—10 of FIG. 8.

Referring to FIGS. 8–10, an alternate embodiment stepped base 14S is illustrated. For simplicity, only the stepped base 14S is illustrated. However, it is to be understood that the stepped base 14S can be a component of the carrier 10 formed substantially as previously described.

The stepped base 14S can be formed out of ceramic, plastic or a polymer resin as previously described. The stepped base 14S includes a stepped active surface 34S. The stepped active surface 34S includes an upper cavity 50 and a lower cavity 52. As shown in FIG. 8, the lower cavity 52 is adapted to retain an interconnect 16S. As shown in FIG. 9, the upper cavity 50 is adapted to retain an interconnect 16S' which is larger than interconnect 16S. An opening 48ST can be provided for installing and removing the interconnect 16S or the interconnect 16S'.

In the configuration shown in FIG. 8, the interconnect 16S is attached to the bottom surface of the lower cavity 52 using an insulating adhesive 46S substantially as previously described. The insulating adhesive 46S also functions to insulate the interconnect 16S from the conductors 40S. Bond wires 44S electrically connect the interconnect 16S to the conductors 40S formed over the stepped active surface 34S.

The conductors 40S extend to approximately the center line of the stepped base 14S and are subjacent to the interconnect 16S in the assembled carrier. In addition, the conductors 40S are formed in a desired universal pattern and with a wire bondable metallurgy that permits wire bonding anywhere along the length of the conductors 40S. As previously explained, this permits minimum length bond wires 44S to be formed regardless of the size of the interconnects 16S or 16S'.

In the configuration shown in FIG. 9, if necessary a spacer 54 can be placed in the lower cavity 52 to support the interconnect 16S'. The spacer 54 can be formed of an insulating material such as plastic or ceramic. In addition, the bottom surface of the interconnect 16S' can be insulated from the conductors 40S by an insulating adhesive (not shown) or by insulating layer (not shown) on the interconnect 16S' as previously described.

Referring to FIG. 11, an alternate embodiment carrier 10I is illustrated. Carrier 10I includes an interconnect 16I, a bridge clamp 24I, a spring 22I and a pressure plate 20I which function in the same manner as the equivalent elements previously described (24, 22, 20-FIG. 1). Carrier 10I also includes a base 14I having openings 48I which function as previously described for base 14 (FIG. 1). In addition carrier 10I includes a seal member 86 that surrounds the interconnect 16T and die 12I and functions to prevent contaminants from entering the interior of the assembled carrier 10I. In particular, contaminants can affect the temporary electrical connection between the test pads 62 (FIG. 3) on the die 12I and the contact members 60 (FIG. 3) on the interconnect 16I.

Carrier 10I also includes an interposer 72 having a pattern of conductors 88 formed thereon. The interposer 72 is configured to make electrical connection with a particular interconnect 16I adapted to test a particular die 12I. The interposer 72 is removably attached to the carrier base 14I and can be easily removed and replaced to permit testing of different types of dice using different types of interconnects. The interposer 72 can be formed of ceramic, FR-4, silicon or polymeric materials.

As shown in FIG. 12, the conductors 88 on the interposer 72 can be arranged in a particular pattern for wire bonding to the interconnect 16I. In addition, the conductors 88 are in electrical communication with external contacts 90 formed along an edge of the interposer 78. The external contacts 90 are adapted for connection to external test circuitry and function substantially the same as the external leads 38 (FIG. 1) previously described. The conductors 88 and contacts 90 can be formed of highly conductive metals such as gold, aluminum, copper or tungsten using a plating, printing or deposition process. Alloys of these metals as well as bi-metal stacks of dissimilar metals can also be used. An electrical path can be formed between the conductors 88 on the interposer 72 and the bonding pads 56 on the interconnect 16I using bond wires 44 as previously described.

Alternately, as shown in FIG. 12A, an electrical path can be formed between the interposer 72 and the interconnect 16I using TAB tape 92. The TAB tape 92 can be conventional two layer TAB tape comprising a flexible film on which conductive traces and microbumps are formed. This type of TAB tape was previously described in connection with the microbump interconnect 16B shown in FIG. 4. In FIG. 12A, the TAB tape 92 can include microbumps (not shown) that can be bonded to the bonding pads 56 on the interconnect 16I and to the conductors 88 on the interposer 72.

Besides wire bonding and TAB tape, an electrical path can also be formed between the interconnect 16I and interposer 72 using a mechanical electrical connection such as the slide clips (44SL-FIG. 3) as previously described.

Figure 13:
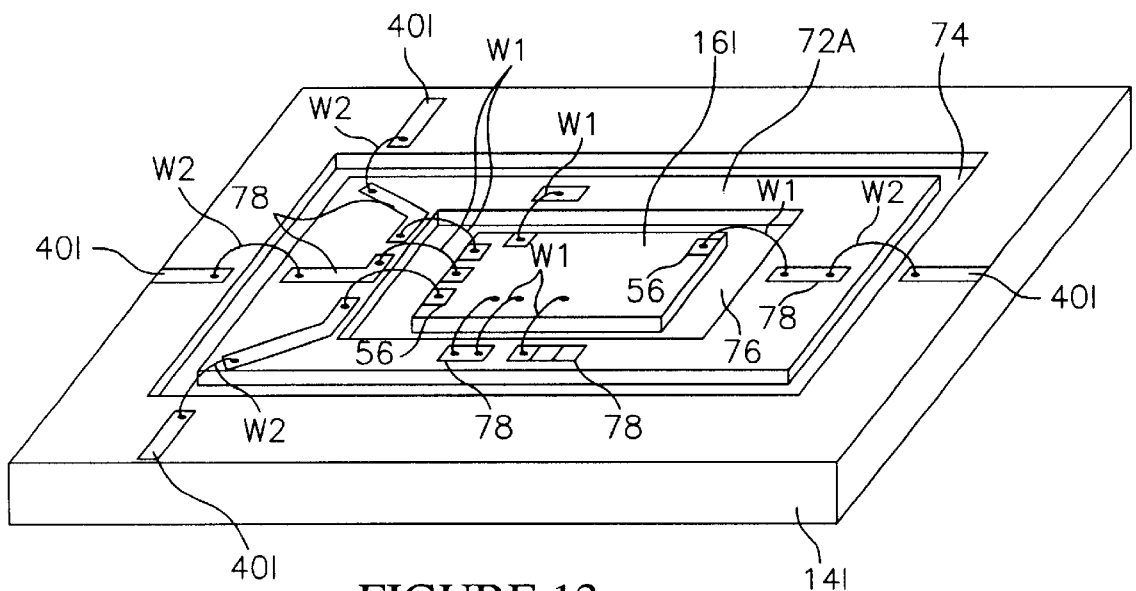
FIG. 13 is a perspective view of another alternate embodiment carrier having an interposer with a cavity for mounting the interconnect.

Referring to FIG. 13, a base 14I adapted for use with an interposer 72A is shown. Base 14I is substantially equivalent to the base 14 (FIG. 1) previously described. The interposer 72A is an element that allows the base 14I to be used with different types and sizes of interconnects 16I. This permits different types and sizes of semiconductor dice 12 (FIG. 1) to be tested by changing the interposer 72A. In other words the interposer 72A permits the carrier 10 to be universal in character yet optimized for a particular device under test (DUT).

For this embodiment, the carrier base 14I includes patterns of conductors 40I. The conductors 40I are in electrical communication with external leads 38 (FIG. 1) substantially as previously described. The carrier base 14I also includes a cavity 74 wherein the interposer 72A is mounted. In this embodiment the cavity 74 and the interposer 72A have a generally rectangular peripheral configuration.

The interposer 72A can be formed of a rigid or semi-rigid material such as FR-4, ceramic, or silicon. Alternately, the interposer 72A can be formed of a flexible material similar to TAB tape or a length of flexible polyimide. The interposer 72A can be formed as a separate member and attached to the base 14I using an adhesive material such as those previously described. Alternately, the interposer 72A can be one or more deposited or printed layers of material.

The interposer 72A includes a cavity 76 wherein the interconnect 16I is mounted. In FIG. 13, the interposer 72A can be formed as a window in which case the cavity would have a lower surface formed by the base 14I. Alternately the interposer 72A can include a bottom surface for the cavity 76. The interconnect 16I can be attached to the interposer 72A (or to the base 14I) using an adhesive material such as those previously described. The interposer 72A also includes patterns of bonding pads 78. Bond wires W1 can be wire bonded to the bonding pads 78 on the interposer 72A and to corresponding bonding pads 56 (FIG. 2) on the interconnect 16I. Bond wires W2 can be wire bonded to selected bonding pads 78 on the interposer and to the conductors 40I on the carrier base 14I. A conductive path is thus provided from the conductors 40I on the base 14I, through bond wires W2, through bonding pads 78, through bond wires W1 and to the bonding pads 56 (FIG. 2) on the interconnect 16I.

Figure 14:
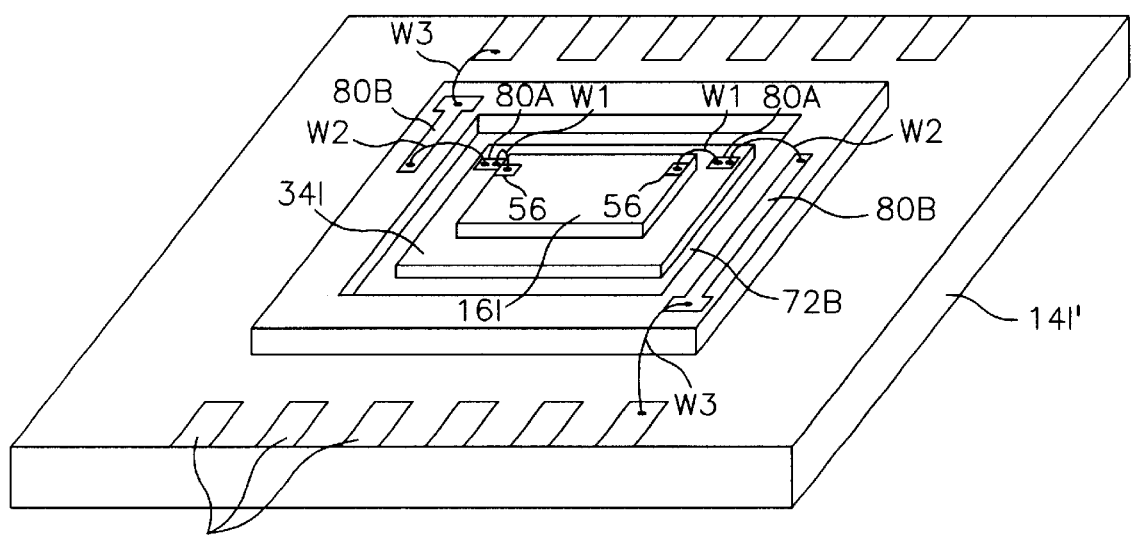
FIG. 14 is a perspective view of another alternate embodiment carrier having an interposer with a flat surface for mounting the interconnect.

Referring to FIG. 14, another carrier base 14I' having an interposer 72B is shown. In this embodiment the interposer 72B includes a planar active surface 34I wherein the interconnect 16I is mounted. The interconnect 16I can be attached to the planar active surface 34I using an adhesive material as previously described. The interposer 72B also includes bonding pads 80A that establish electrical communication with the individual bonding pads 56 (FIG. 2) on the interconnect 16I via bond wires W1. In addition, the interposer 72B includes bonding pads 80B which establish electrical communication with several bonding pads 80A via bond wires W2. Bonding pads 80B in turn are in electrical communication with the conductors 40I on the carrier base 14I' via bond wires W3.

While the invention has been described with reference to certain preferred embodiments, as will be apparent to those skilled in the art, certain changes and modifications can be made without departing from the scope of the invention as defined by the following claims.

What is claimed is:

1. A method for testing semiconductor dice comprising:

providing a base comprising a plurality of conductors including a first set of bonding sites and a second set of bonding sites;

placing a first interconnect on the conductors comprising a plurality of first contact members configured to electrically contact a first die;

forming electrical paths between the first set of bonding sites and the first contact members;

placing the first die in electrical contact with the first contact members and applying test signals through the first contact members to the first die;

removing the first interconnect from the base;

placing a second interconnect on the conductors comprising a plurality of second contact members configured to electrically contact a second die of a different type than the first die;

forming electrical paths between the second set of bonding sites and the second contact members;

placing the second die in electrical contact with the second contact members and applying test signals through the second contact members to the second die.

2. The method of claim 1 wherein the first die comprises a package.

3. The method of claim 1 wherein the second die comprises a package.

4. A method for testing semiconductor dice comprising:

providing an interconnect comprising a plurality of contact members configured to electrically contact a first die;

providing a base having an active surface for mounting the interconnect;

providing a plurality of conductors on the active surface having a first set of bonding sites and a second set of bonding sites, the conductors configured in a pattern such that the interconnect, or a second interconnect for a second die of a different type than the first die, can be placed on the conductors with the contact members on the interconnect in electrical communication with the first set of bonding sites, or the second contact members on the second interconnect in electrical communication with the second set of bonding sites;

placing the interconnect on the conductors with the contact members in electrical communication with the first set of bonding sites;

placing the first die on the interconnect with the contact members and the first die in electrical communication;

applying test signals to the first die.

removing the interconnect from the conductors;

placing the second interconnect on the conductors with the second contact members in electrical communication with the second set of bonding sites;

placing the second die on the second interconnect with the second contact members and the second die in electrical communication; and applying test signals to the second die.

* * * * *

UNITED STATES PATENT AND TRADEMARK OFFICE
CERTIFICATE OF CORRECTION

PATENT NO.   : 6,255,833 B1
DATED        : July 3, 2001
INVENTOR(S)  : Salman Akram, Alan G. Wood, David R. Hembree, Warren M. Farnworth It is certified that error appears in the above-identified patent and that said Letters Patent is hereby corrected as shown below:

<u>Column 10, claim 4,</u>
Line 29, replace the period "." with a semicolon -- ; --.

Signed and Sealed this

Twenty-second Day of January, 2002

Attest:

JAMES E. ROGAN
*Attesting Officer*     *Director of the United States Patent and Trademark Office*